(12) United States Patent
Kim

(10) Patent No.: US 10,186,600 B2
(45) Date of Patent: Jan. 22, 2019

(54) ELECTRONIC DEVICE INCLUDING TRANSISTOR AND METHOD FOR FABRICATING THE SAME

(71) Applicant: SK hynix Inc., Icheon-Si (KR)

(72) Inventor: Sang-Soo Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 126 days.

(21) Appl. No.: 15/299,323

(22) Filed: Oct. 20, 2016

(65) Prior Publication Data

US 2017/0236919 A1 Aug. 17, 2017

(30) Foreign Application Priority Data

Feb. 16, 2016 (KR) ........................ 10-2016-0017678

(51) Int. Cl.
| | |
|---|---|
| H01L 29/66 | (2006.01) |
| H01L 21/3065 | (2006.01) |
| H01L 21/308 | (2006.01) |
| H01L 27/108 | (2006.01) |
| H01L 27/22 | (2006.01) |
| H01L 27/24 | (2006.01) |
| H01L 29/417 | (2006.01) |
| H01L 29/423 | (2006.01) |
| H01L 29/45 | (2006.01) |

(52) U.S. Cl.
CPC .... *H01L 29/66621* (2013.01); *H01L 21/3065* (2013.01); *H01L 21/3081* (2013.01); *H01L 27/10876* (2013.01); *H01L 27/228* (2013.01); *H01L 27/2436* (2013.01); *H01L 29/4175* (2013.01); *H01L 29/4236* (2013.01); *H01L 29/456* (2013.01)

(58) Field of Classification Search
CPC combination set(s) only.
See application file for complete search history.

(56) References Cited

U.S. PATENT DOCUMENTS

| | | | |
|---|---|---|---|
| 2013/0344666 A1* | 12/2013 | Moon | ............... H01L 27/10823 438/259 |
| 2014/0061779 A1* | 3/2014 | Kim | .................. H01L 29/66666 257/330 |

FOREIGN PATENT DOCUMENTS

| | | |
|---|---|---|
| KR | 10-2011-0016214 A | 2/2011 |
| KR | 10-1075526 B1 | 10/2011 |

* cited by examiner

*Primary Examiner* — Ratisha Mehta
(74) *Attorney, Agent, or Firm* — Perkins Coie LLP

(57) ABSTRACT

A method for fabricating an electronic device is provided to include: forming a hard mask pattern over a substrate to expose a gate formation region; forming a gate trench by etching the substrate using the hard mask pattern; forming a gate insulating layer over an inner wall of the gate trench; forming a gate electrode filling a lower portion of the gate trench in which the gate insulating layer is formed; forming an insulating material covering a resultant structure in which the gate electrode is formed; forming a gate protective layer having a top surface lower than a bottom surface of the hard mask pattern; removing the hard mask pattern; recessing the substrate so that a top surface of the substrate is lower than the top surface of the gate protective layer; and forming a conductive pattern filling a space formed by the recessing of the substrate.

14 Claims, 11 Drawing Sheets

ELECTRONIC DEVICE INCLUDING TRANSISTOR AND METHOD FOR FABRICATING THE SAME

CROSS-REFERENCE TO RELATED APPLICATION

This patent document claims priority of Korean Patent Application No. 10-2016-0017678, entitled "ELECTRONIC DEVICE INCLUDING TRANSISTOR AND METHOD FOR FABRICATING THE SAME" and filed on Feb. 16, 2016, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a characteristic switched between different resistant states according to an applied voltage or current, and can be implemented in various configurations, for example, an RRAM (resistive random access memory), a PRAM (phase change random access memory), an FRAM (ferroelectric random access memory), an MRAIVI (magnetic random access memory), an E-fuse, etc.

SUMMARY

The disclosed technology in this patent document includes memory circuits or devices and their applications in electronic devices or systems and various implementations of an electronic device, in which an electronic device may provide a transistor having an excellent characteristic and a method of fabricating the same.

In one aspect, a method for fabricating an electronic device comprising a transistor is provided. The method comprises: forming a hard mask pattern over a semiconductor substrate to expose a gate formation region; forming a gate trench by etching the semiconductor substrate using the hard mask pattern as an etching barrier; forming a gate insulating layer over an inner wall of the gate trench; forming a gate electrode in a lower portion of the gate trench in which the gate insulating layer is formed to be in contact with the gate electrode; forming an insulating material covering a resultant structure in which the gate electrode is formed; forming a gate protective layer having a top surface lower than a bottom surface of the hard mask pattern by recessing the insulating material; removing the hard mask pattern; recessing the semiconductor substrate so that a top surface of the semiconductor substrate is lower than the top surface of the gate protective layer; and forming a conductive pattern filling a space formed by the recessing of the semiconductor substrate.

Implementations of the above method may include one or more of the following.

The forming of the gate protective layer is performed to expose the gate insulating layer, and the method further comprising: recessing the exposed gate insulating layer after the forming of the gate protective layer. The recessing of the exposed gate insulating layer and the removing of the hard mask pattern are performed at the same time. The recessing of the exposed gate insulating layer is performed before or after the removing of the hard mask pattern. The recessing of the semiconductor substrate is performed using a top surface of the recessed gate insulating layer as a target. The recessing of the semiconductor substrate is performed using an isotropic etching method. The semiconductor substrate includes a silicon, and the recessing of the semiconductor substrate is performed using $NF_3$ gas. The semiconductor substrate includes a silicon, the conductive pattern includes a metal, and the method further comprising: forming a metal silicide layer at an interface between the conductive pattern and the semiconductor substrate by performing a heat treatment, after the forming of the conductive pattern. The method further comprising: forming a memory element coupled to the conductive pattern, after the forming of the conductive pattern.

In another aspect, a method for fabricating an electronic device comprising a transistor is provided. The method comprises: forming a gate trench by selectively etching a semiconductor substrate; forming a gate insulating layer over an inner wall of the gate trench; forming a gate electrode by filling an electrically conductive material into a lower portion of the gate trench in which the gate insulating layer is formed; forming a gate protective layer located in the gate trench and over the gate electrode; recessing the gate insulating layer so that a portion of the semiconductor substrate protrudes above the gate insulating layer; recessing the semiconductor substrate by performing an isotropic etching to the protruding portion of the semiconductor substrate; and forming a conductive pattern filling a space formed by the recessing of the semiconductor substrate.

Implementations of the above method may include one or more of the following.

The recessing of the semiconductor substrate is performed using a top surface of the recessed gate insulating layer as a target. The semiconductor substrate includes a silicon, and the recessing of the semiconductor substrate is performed using $NF_3$ gas. The semiconductor substrate includes a silicon, the conductive pattern includes a metal, and the method further comprising: forming a metal silicide layer at an interface between the conductive pattern and the semiconductor substrate by performing a heat treatment, after the forming of the conductive pattern. The method further comprising: forming a memory element coupled to the conductive pattern, after the forming of the conductive pattern.

In another aspect, an electronic device includes a transistor, and the transistor includes a semiconductor substrate including an active region defined by an isolation layer; a gate electrode crossing the active region; and a landing plug contact formed over the active region at both sides of the gate electrode, and wherein a top surface of the active region at both sides of the gate electrode has a shape that a center relatively far from the gate electrode is higher than an edge relatively near to the gate electrode.

Implementations of the above electronic device may include one or more the following.

The transistor further comprises: a metal silicide layer located at an interface between the landing plug contact and the active region. The transistor further comprises: a memory element formed over the active region at one side of the gate electrode and coupled to the landing plug contact. The memory element includes a variable resistance element which is switched between different resistant states according to an applied voltage or current. The variable resistance element includes a pinned layer having a pinned magnetization direction, a free layer having a variable magnetization direction, and a tunnel barrier layer interposed therebetween. The top surface of the active region at both sides of the gate electrode has a shape that the center protrudes than the edge. The top surface of the active region at both sides of the gate electrode includes a convex surface.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the transistor is part of at least one of the control unit, the operation unit and the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the transistor is part of at least one of the core unit, the cache memory unit and the bus interface in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the transistor is part of at least one of the processor, the auxiliary memory device, the main memory device and the interface device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the transistor is part of at least one of the controller, the storage device, the temporary storage device and the interface in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the transistor is part of at least one of the memory controller, the memory, the buffer memory and the interface in the memory system.

These and other aspects, implementations and associated advantages are described in greater detail in the drawings, the description and the claims.

DETAILED DESCRIPTION

Figure 1A:
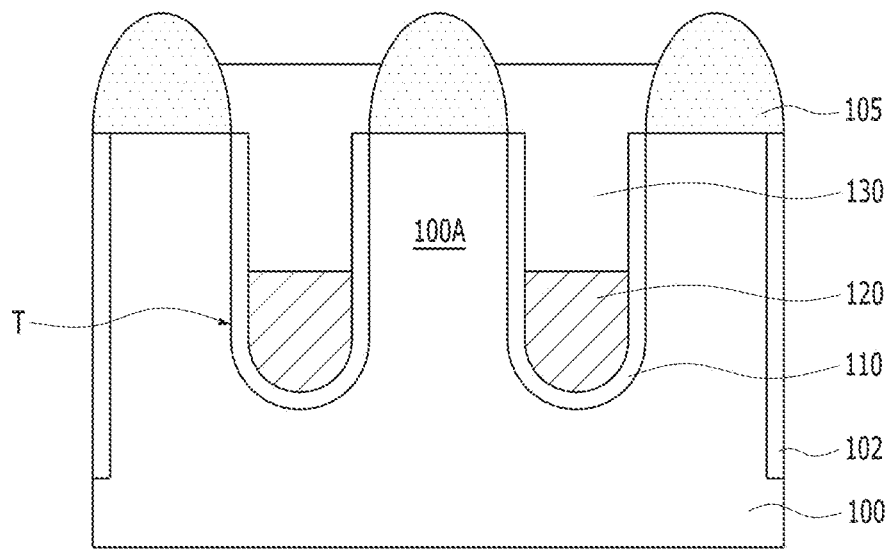
FIGS. 1A to 1E are cross-sectional views explaining a method for fabricating a transistor in accordance with a comparative example, and a problem thereof.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

A semiconductor memory according to an implementation may include a cell array in which a plurality of memory cells for storing data are arranged. Here, each of the memory cells may include a memory element for actually storing data and an access element for controlling an access to the memory element. A transistor may be used as the access element. In the implementation, a transistor having an improved characteristic and a semiconductor memory using this transistor may be provided. Hereinafter, the implementation will be described with reference to drawings in more detail.

Prior to describing the implementation, a method for fabricating a transistor in accordance with a comparative example, and a problem thereof will be described.

FIGS. 1A to 1E are cross-sectional views explaining a method for fabricating a transistor in accordance with a comparative example, and a problem thereof.

Referring to FIG. 1A, a semiconductor substrate 100 having an active region 100A defined by an isolation layer 102 may be provided. The semiconductor substrate 100 may include a silicon, and the isolation layer 102 may include a silicon oxide.

Then, a hard mask pattern 105 exposing a gate formation region may be formed over the semiconductor substrate 100, and then, a gate trench T providing a space in which a gate of a transistor is to be formed may be formed by etching the isolation layer 102 and the active region 100A using the hard mask pattern 105 as an etching barrier. The hard mask pattern 105 may include a silicon oxide.

Then, a gate insulating layer 110 may be formed along an inner wall of the gate trench T, and then, a gate electrode 120 filling a lower portion of the gate trench T in which the gate insulating layer 110 is formed may be formed. The gate insulating layer 110 may include a silicon oxide, and the gate electrode 120 may include a metal such as W, a metal nitride such as TiN, or a combination thereof. The gate electrode 120 may be formed by depositing a conductive material to a thickness enough to fill the gate trench T in which the gate insulating layer 110 is formed, and performing an etch-back to the conductive material.

Here, the hard mask pattern 105 may have a uniform thickness shortly after the formation of the hard mask pattern 105. However, during the etching process for forming the gate trench T and the etch-back process for forming the gate electrode 120, the hard mask pattern 105 may be etched away unevenly so that a center portion of the hard mask pattern 105 is etched less than its peripheral regions so that the center portion of the hard mask pattern 105 may become thicker than an edge of the hard mask pattern 105 to form a doom shape at the end of this etching processing.

Next, a gate protective layer 130 filling a space between the hard mask patterns 105 and a remaining space of the gate trench T in which the gate insulating layer 110 and the gate electrode 120 are formed may be formed by forming an insulating material covering a resultant structure in which the gate electrode 120 is formed, and recessing the insulating material so as to expose the hard mask pattern 105. The gate protective layer 130 may include suitable protective materials such as a silicon nitride in some implementations. Also, the gate protective layer 130 may have a shape of which a width increases from bottom to top between the hard mask patterns 105.

Figure 1B:
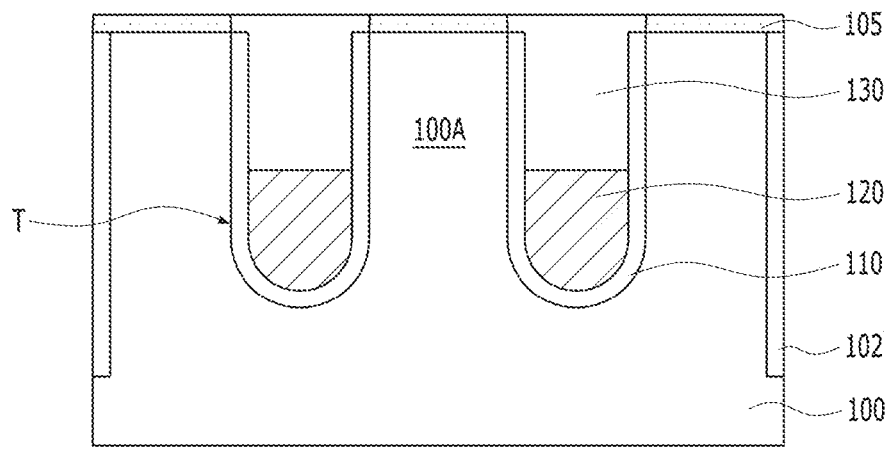

Referring to FIG. 1B, an etching process may be performed to remove the hard mask pattern 105. During this process, a portion of the gate protective layer 130 may be removed.

However, since the gate protective layer 130 has a large width to hide a lower portion of the hard mask pattern 105 during the removing of the hard mask pattern 105, the hard mask pattern 105 may not be completely removed and some material for the hard mask pattern 105 may remain in some regions as shown in FIG. 1B. For this reason, a subsequent process of FIG. 1C may be performed in order to remove the remainder of the hard mask pattern 105.

Figure 1C:
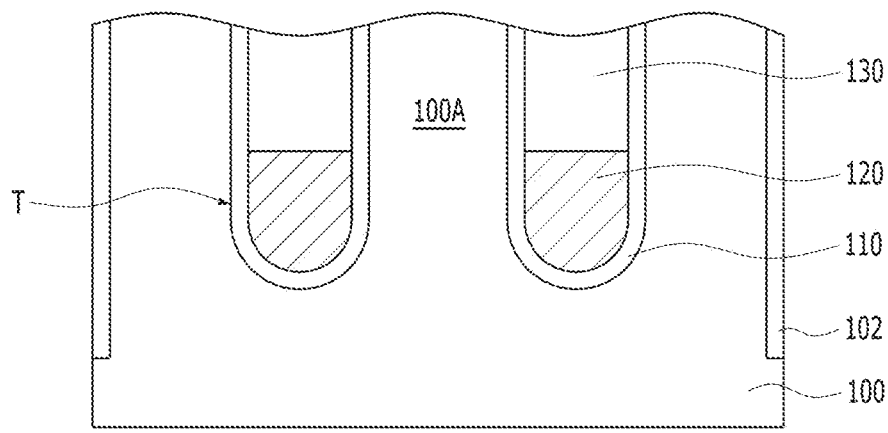

Referring to FIG. 1C, an additional etching process may be performed to completely remove the remaining hard mask pattern 105. When the hard mask pattern 105 includes a silicon oxide and the active region 100A includes a silicon, an etching selectivity between the hard mask pattern 105 and the active region 100A may not be high. Therefore, in this additional etching process, a portion of the active region 100A located under the hard mask pattern 105 may be removed along with the remainder of the hard mask pattern 105. Furthermore, a portion of the gate protective layer 130 filled in the trench may also be removed in this etch process to form a slightly curved surface profile having a dip in the center as shown in FIG. 1C.

Figure 1D:
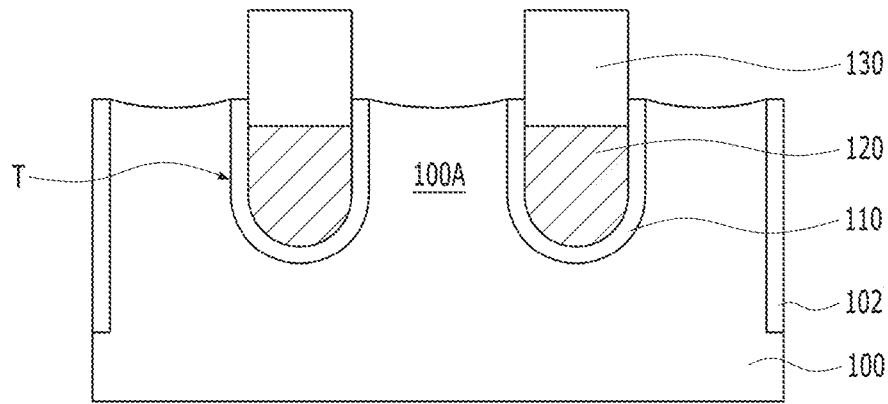

Referring to FIG. 1D, the structure in FIG. 1C may be further patterned so that the active region 100A may be recessed to render a top surface of the active region 100A to be lower than the top of the gate protective layer 130. This patterning creates a predetermined distance between the top of the gate protective layer 130 and the top of the active region 100A to provide a space in which a landing plug contact is to be formed. When the active region 100A includes a silicon and the gate insulating layer 110 and/or the isolation layer 102 includes a silicon oxide, a portion of the gate insulating layer 110 and/or the isolation layer 102 may be lost during the recessing of the active region 100A. Here, the top surface of the recessed active region 100A may have a concave shape that a center portion is lower than an edge. This is because the edge of the active region 100A is adjacent to the gate insulating layer 110 and/or the isolation layer 102 to be less influenced by an etching process compared to the center portion.

Figure 1E:
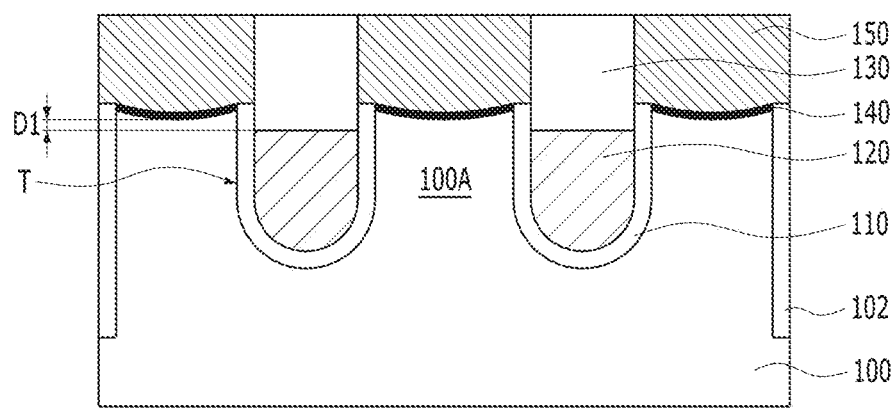

Referring to FIG. 1E, a landing plug contact 150 is an electrically conductive structure and may be formed by filling a space formed by the recessing of the active region 100A with a conductive material. In implementations, the landing plug contact 150 may include suitable electrically conductive materials, including, e.g., a metal, a metal nitride or a combination thereof.

When the landing plug contact 150 includes a metal and a heat treatment can be further performed after the landing plug contact 150 is formed, a metal silicide layer 140 may be formed at an interface between the landing plug contact 150 and the active region 100A by reaction of the metal of the landing plug contact 150 and the silicon of the active region 100A. Therefore, the landing plug contact 150 having a low resistance may be achieved in the above process.

By the aforementioned processes, a transistor shown in FIG. 1E may be formed, where this transistor includes a buried gate electrode 120 in the trench that is insulated from the active regions 100A by the curved gate insulating layer 110 in the trench and two diffusion regions as the source and drain under the landing plug contacts 150. This transistor may be coupled to a memory element, for example, a variable resistance element such as a magnetic tunnel junction element, to form a memory cell.

However, certain undesired effects or technical problems may occur in the above processes shown in FIGS. 1A-1E.

First, since the active region 100A is recessed by the process of FIG. 1D in a state that the active region 100A is primarily removed in the process of FIG. 1C, a distance D1 between a top surface of the active region 100A and a top surface of the gate electrode 120 is relatively small. When the distance D1 is small, an effective channel length of the transistor may be reduced, so a problem that a resistance of a memory cell increases may occur.

Also, it is difficult to control a degree of loss or an amount of the material removal of the active region 100A and/or the gate protective layer 130 during the process of FIG. 1C. Therefore, it may be difficult to control subsequent processes. For example, a degree of loss of the active region 100A may vary depending on regions, and for this reason, it may be difficult to control a depth of a recess of the active region 100A uniformly in different regions in the process of FIG. 1D.

The present implementation will provide a transistor and a method for fabricating the same in order to solve the above various problems.

Figure 2A:
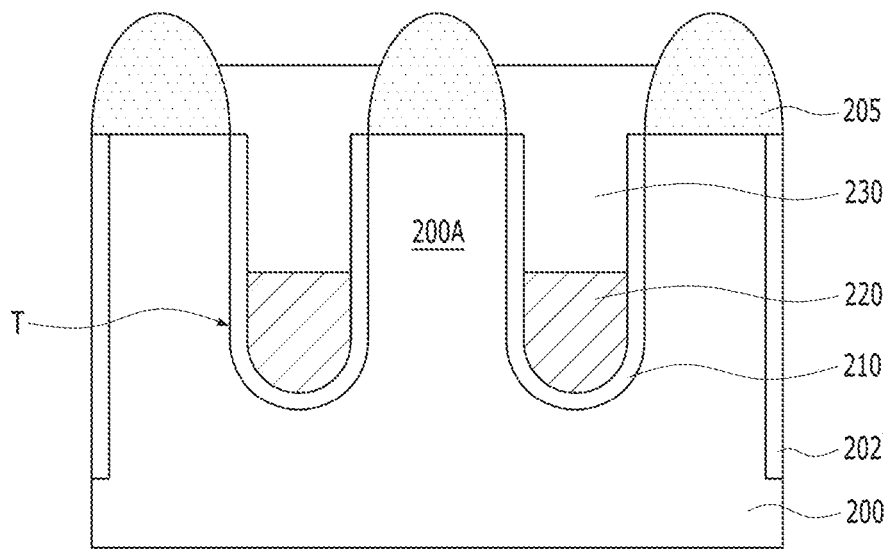
FIGS. 2A to 2E are cross-sectional views explaining a transistor and a method for fabricating the same in accordance with an implementation of the present disclosure.
Figure 2B:
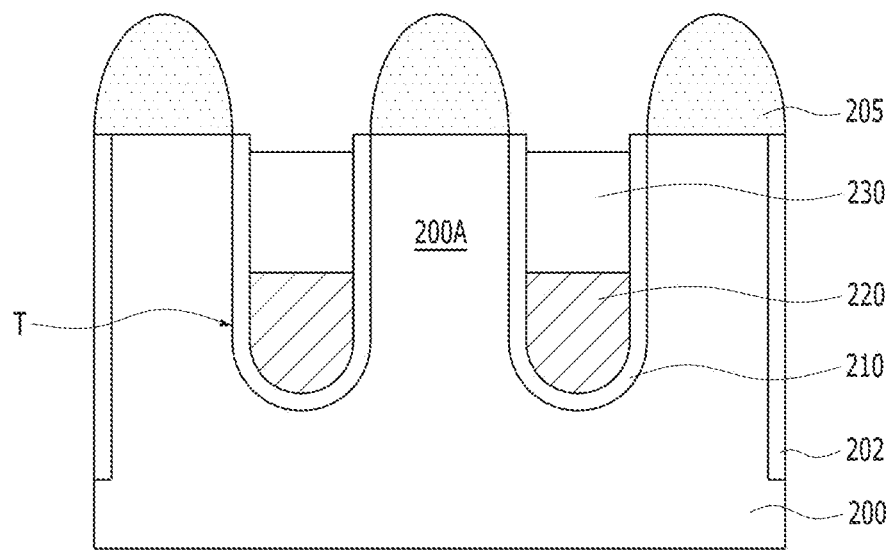
Figure 2C:
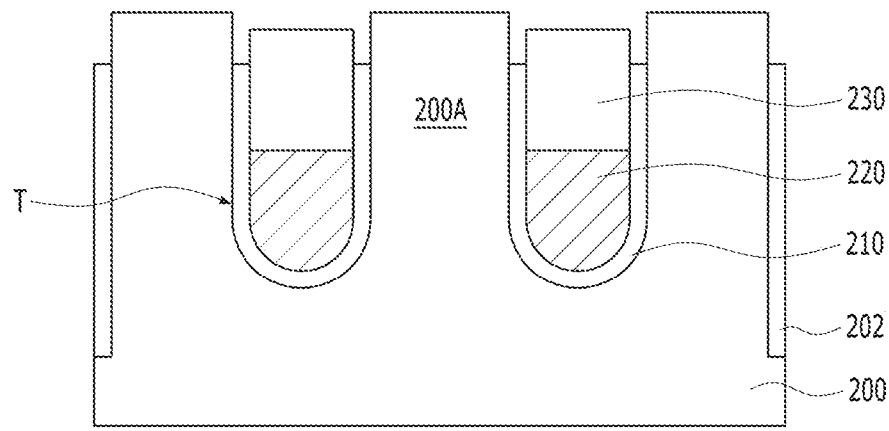
Figure 2D:
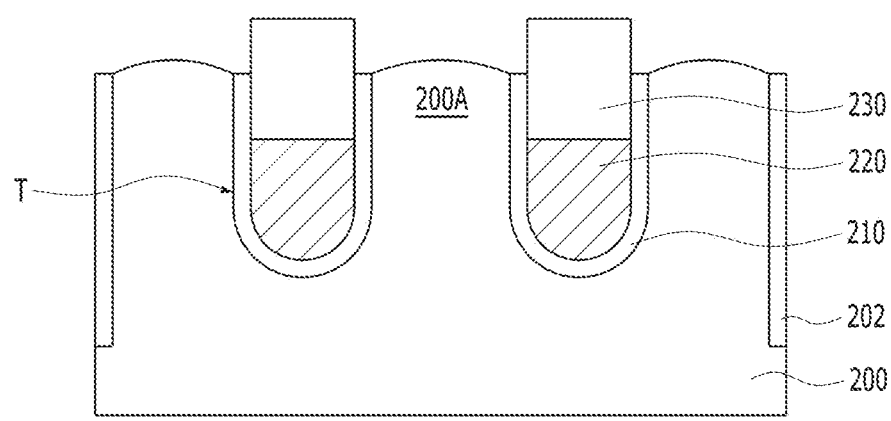
Figure 2E:
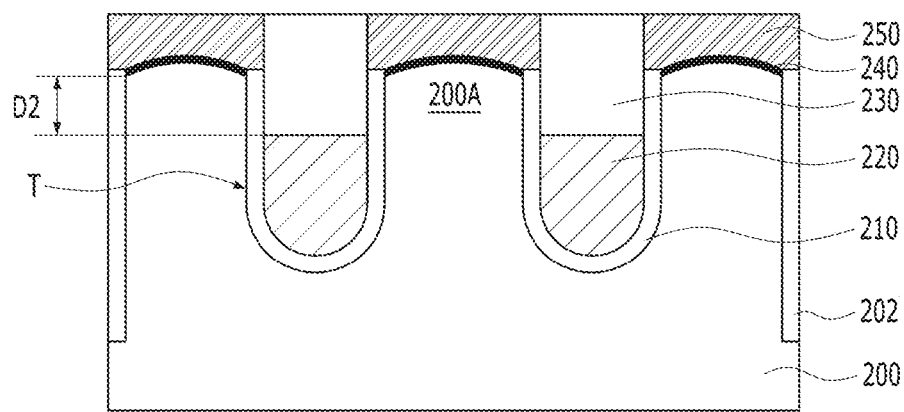
Figure 2F:
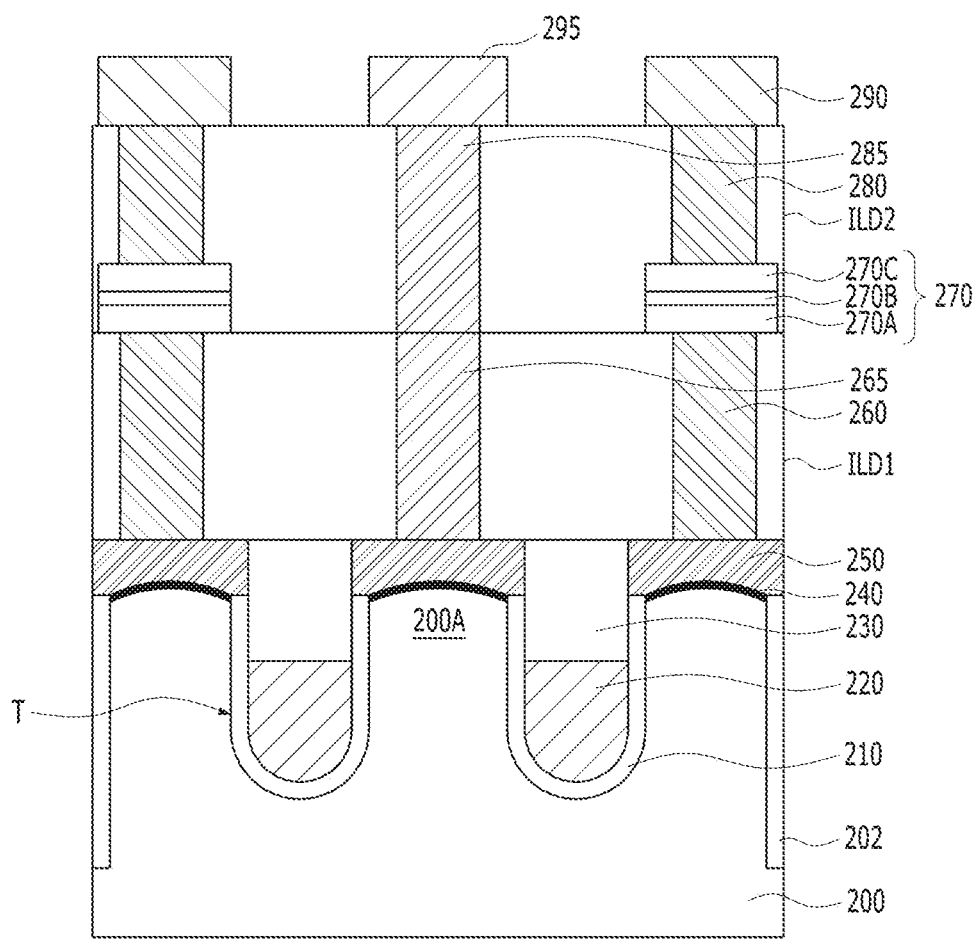
FIG. 2F is a cross-sectional view explaining a semiconductor device including the transistor of FIG. 2E.
Figure 3:
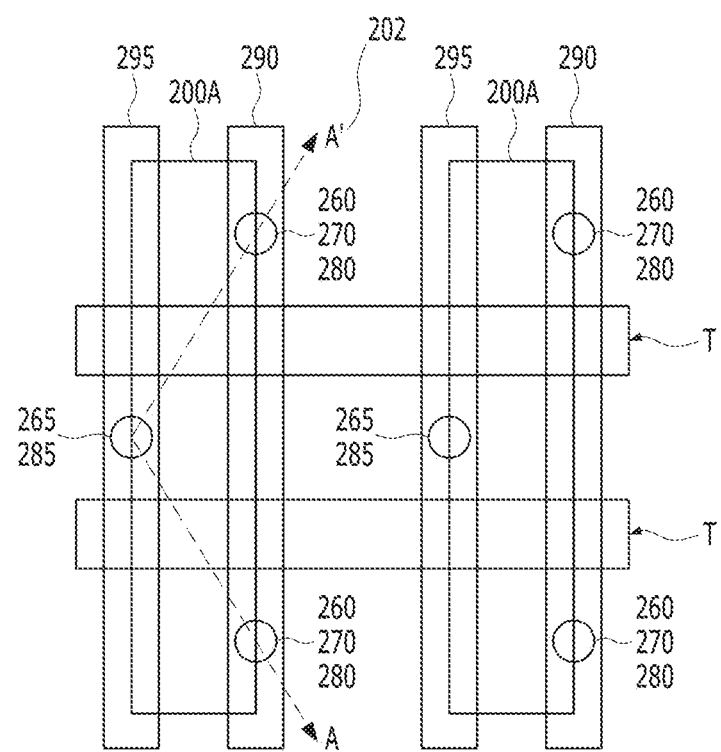
FIG. 3 is a plan view corresponding to the semiconductor device of FIG. 2F.

FIGS. 2A to 2E are cross-sectional views explaining a transistor and a method for fabricating the same in accordance with an implementation of the present disclosure, FIG. 2F is a cross-sectional view explaining a semiconductor device including the transistor of FIG. 2E, and FIG. 3 is a plan view corresponding to the semiconductor device of FIG. 2F. The cross-sectional views of FIGS. 2A to 2F are illustrated according to a line A-A' of FIG. 3.

Referring to FIG. 2A, a semiconductor substrate 200 may be provided. The semiconductor substrate 200 may include various semiconductor materials, such as a silicon.

An isolation layer 202 may be formed in the semiconductor substrate 200 to define an active region 200A of the semiconductor substrate 200. The isolation layer 202 may be formed by selectively etching an isolation region of the semiconductor substrate 200 to form an isolation trench, and filling the isolation trench with an insulating material such as a silicon oxide, a silicon nitride, etc. In the present implementation as illustrated, a plurality of active regions 200A may be arranged to be spaced apart from each other in a first direction, for example, in a lateral direction. Each of the active regions 200A may have a line shape extending in a second direction crossing the first direction, for example, in a longitudinal direction. However, a shape, a number and an arrangement of the active regions 200A may be changed in various manners.

A hard mask pattern 205 exposing gate formation regions may be formed over the semiconductor substrate 200, and then, a gate trench T providing a space in which a gate of a transistor is to be formed may be formed by etching the isolation layer 202 and the active region 200A using the hard mask pattern 205 as an etching barrier. In the present implementation, a plurality of gate trenches T may be arranged to be spaced apart from each other in the second direction, and each of the gate trenches T may extend in the first direction to cross the active region 200A. However, a shape, a number and an arrangement of the gate trenches T may be changed in various manners. The hard mask pattern 205 may include a silicon oxide.

As illustrated, a gate insulating layer 210 may be formed along an inner wall of the gate trench T. The gate insulating layer 210 may be formed by a thermal oxidation process or deposition process of an insulating material, and include a silicon oxide.

Next, a gate electrode 220 is filled into a lower portion of the gate trench T in which the gate insulating layer 210 is formed. The gate electrode 220 may be formed by forming a conductive material such as a metal, a metal nitride, etc., over a resultant structure in which the gate insulating layer 210 is formed, and performing an etch-back process to the conductive material until the conductive material has a desired height.

The hard mask pattern 205 may have a uniform thickness shortly after the initial formation of the hard mask pattern 205. However, during the etching process for forming the gate trench T and the etch-back process for forming the gate electrode 220, the hard mask pattern 205 may be etched away unevenly so that a center portion of the hard mask pattern 205 is etched less than its peripheral regions and becomes thicker than an edge of the hard mask pattern 205, forming a doom shape at the end of this etching processing.

Next, a gate protective layer 230 may be formed over the gate electrode 220. The gate protective layer 230 may be formed by forming an insulating material covering a resultant structure in which the gate electrode 220 is formed, and recessing the insulating material so as to expose the hard mask pattern 205. Therefore, the gate protective layer 230 may fill a space between the hard mask patterns 205 and a remaining space of the gate trench T in which the gate insulating layer 210 and the gate electrode 220 are formed. The gate protective layer 230 may include a silicon nitride. As described above, since the center portion of the hard mask pattern 205 is thicker than the edge of the hard mask pattern 205, an upper portion of the gate protective layer 230 located between the hard mask patterns 205 may have a shape of which a width increases from bottom to top.

Referring to FIG. 2B, the gate protective layer 230 may be recessed by etching the upper portion of the gate protective layer 230. Here, the gate protective layer 230 may be recessed until the gate insulating layer 210 is exposed. Furthermore, the gate protective layer 230 may have a top surface lower than a top surface of the active region 200A and/or a bottom surface of the hard mask pattern 205.

Since the upper portion of the gate protective layer 230 of which a width increases from bottom to top is removed by the present process, an entire surface of the hard mask pattern 205 may be completely exposed.

Referring to FIG. 2C, the hard mask pattern 205 may be removed. Since the hard mask pattern 205 is completely exposed, the hard mask pattern 205 may be completely removed by a single etching process. The hard mask pattern 205 may be removed by a wet cleaning process. Furthermore, the hard mask pattern 205 may be removed under a process condition that an etching selectivity of a silicon oxide to a silicon nitride and a silicon is very high.

Here, when the gate insulating layer 210 includes a material substantially same as the hard mask pattern 205, a portion of the gate insulating layer 210 exposed by the removal of the hard mask pattern 205 may be removed in this process. On the other hand, when the gate insulating layer 210 includes a material different from the hard mask pattern 205, an etching process for removing a portion of the gate insulating layer 210 may be further performed before or after the removal of the hard mask pattern 205. As a result, a top surface of the gate insulating layer 210 may be lower than a top surface of the gate protective layer 230 and/or a top surface of the active region 200A to a predetermined distance.

Referring to FIG. 2D, the active region 200A may be recessed so that a top surface of the active region 200A is lower than a top surface of the gate protective layer 230 to a predetermined distance in order to provide a space in which a landing plug contact is to be formed. The active region 200A may be recessed by an isotropic dry etching method. Here, since not only a top surface of the active region 200A but also a portion of a sidewall of the active region 200A are exposed to an etching gas by the above removal process of a portion of the gate insulating layer 210, a top surface of the recessed active region 200A may have a convex shape that a center portion is higher than an edge. In the present process, a top surface of the recessed gate insulting layer 210 may be an etching target during the recessing of the active region 200A. In the present etching process, when the active region 200A includes a silicon, the gate insulating layer 210 includes a silicon oxide and a gate protective layer 230 includes a silicon nitride, a gas having a high etching selectivity of a silicon to a silicon oxide and a silicon nitride, for example, $NF_3$ gas may be used. The $NF_3$ gas may enable a selective etching to Si by transforming Si into $SiF_4$ using an ionized fluorine. Furthermore, in the present etching process, various additional gases, for example, $H_2$ gas, He gas, etc., may be further used, and several parameters such as a flowing rate, an RF (Radio Frequency) power or a temperature of these gases may be controlled to properly control a degree of etching.

Referring to FIG. 2E, a landing plug contact 250 may be formed by filling a space formed by the recessing of the active region 200A with a conductive material. Here, the landing plug contact 250 may include a metal such as Ti, a metal nitride such as TiN or a combination thereof.

When the landing plug contact 250 includes a metal and a heat treatment is further performed after the landing plug contact 250 is formed, a metal silicide layer 240 may be formed at an interface between the landing plug contact 250 and the active region 200A by reaction of the metal of the landing plug contact 250 and the silicon of the active region 200A. The metal silicide layer 240 may include TiSix. Therefore, the landing plug contact 250 having a low resistance may be implemented.

By the aforementioned processes, a transistor shown in FIG. 2E may be formed, where this transistor includes a buried gate electrode 220 in the trench that is insulated from the active regions 200A by the curved gate insulating layer 210 in the trench and two diffusion regions as the source and drain under the landing plug contacts 250.

Referring again to FIG. 2E, the transistor of the present implementation may include the semiconductor substrate 200 including the active region 200A defined by the isolation layer 202, the gate trench T formed in the semiconductor substrate 200 and extending in the first direction to cross the active region 200A, the gate electrode 220 filled in the gate trench T, and a stack structure of the metal silicide layer 240 and the landing plug contact 250 formed over the active region 200A at both sides of the gate electrode 220. The active region 200A at one side of the gate electrode 220 may serve as a source region, and the active region 200A at the other side of the gate electrode 220 may serve as a drain region.

Here, a top surface of the active region 200A may have a convex shape that a center portion is higher than an edge. Therefore, considering the metal silicide layer 240, there may be a distribution that a metal silicide of a center portion may be higher than a metal silicide of an edge. Also, a bottom surface of the landing plug contact 250 may have a shape that a center portion is higher than an edge.

The above implementations may be used to achieve one or more following advantages.

First, since the hard mask pattern 205 is completely removed by recessing the gate protective layer 230, the process of FIG. 1C of the comparative example may be skipped. Therefore, it is possible to reduce a loss of the active region 200A so that a distance D2 between a top surface of the active region 200A and a top surface of the gate electrode 220 increases. As a result, a channel length of the transistor may increase and a resistance of a memory cell may be reduced.

Also, since the process of FIG. 1C of the comparative example is skipped, a loss of the active region 200A and/or the gate protective layer 230 before recessing the active region 200A may be prevented. Therefore, it may be easy to control subsequent processes. For example, an initial state of the active region 200A before recessing the active region 200A may be controlled to be uniform regardless of regions, so a depth of a recess of the active region 200A may be controlled uniformly.

Also, since the recess process of the active region 200A is performed using a top surface of the pre-recessed gate insulating layer 210 as a target, it may be easy to control a depth of a recess of the active region 200A uniformly.

Furthermore, when $NF_3$ gas is used during an isotropic dry etching process for recessing the active region 200A, a roughness of a top surface of the recessed active region 200A may increase. As a result, a contact resistance of the metal silicide layer 140 may be further reduced.

Meanwhile, the transistor of FIG. 2E may be used as an access element for an access to a memory element in various semiconductor memories. Specially, the transistor may be coupled to a memory element which requires a high operating current, for example, a variable resistance element such as a magneto-resistive element which requires a high current when being switched between a high resistant state and a low resistant state. Hereinafter, this implementation will be exemplarily described in more detail with reference to FIGS. 2F and 3.

Referring to FIGS. 2F and 3, the semiconductor memory according to the present implementation may include a variable resistance element 270 which has a bottom end coupled to one end of the transistor of FIG. 2E, for example, a landing plug contact 250 at both sides of two gate electrodes 220 adjacent to each other in the second direction, a bit line 290 coupled to a top end of the variable resistance element 270, and a source line 295 coupled to the other end of the transistor of FIG. 2E, for example, the landing plug contact 250 disposed between the two gate electrodes 220. For example, the active region 200A at both sides of the two gate electrodes 220 may serve as a drain region, and the active region 200A located between the two gate electrodes 220 may serve as a source region.

Specifically, a first interlayer dielectric layer ILD1 may be formed over a resultant structure of FIG. 2E. In the first interlayer dielectric layer ILD1, a first lower contact 260 and a second lower contact 265 penetrating through the first interlayer dielectric layer ILD1 may be formed to be coupled to the landing plug contact 250. The first lower contact 260 may be formed over the landing plug contact 250 coupled to the drain region, and the second lower contact 265 may be formed over the landing plug contact 250 coupled to the source region.

Here, the first lower contact 260 may be disposed over one side of the active region 200A in the first direction, for example, a right side. On the other hand, the second lower contact 265 may be disposed over the other side of the active region 200A in the first direction, for example, a left side. This is for securing a distance between a first stacked structure of the first lower contact 260, the variable resistance element 270, a first upper contact 280 and the bit line 290 and a second stacked structure of the second lower contact 265, a second upper contact 285 and the source line 295.

A memory element, for example, the variable resistance element 270 may be formed over the first interlayer dielectric layer ILD1 to be coupled to the first lower contact 260.

Here, the variable resistance element 270 may be switched between different resistant states according to an applied voltage or current through the transistor coupled to the bottom end of the variable resistance element 270 and the bit line 290 coupled to the top end of the variable resistance element 270. The variable resistance element 270 may be formed of a single layer or a multiple layer including various materials which are used an RRAM, a PRAM, an FRAM, an MRAM, etc, for example, a metal oxide such as a transition metal oxide or a perovskite-based material, a phase change material such as a chalcogenide-based material, a ferroelectric material, a ferromagnetic material, etc. The variable resistance element 270 may store different data depending on resistant states.

In this implementation, the variable resistance element 270 may include an MTJ (Magnetic Tunnel Junction) structure including a pinned layer 270A having a pinned magnetization direction, a free layer 270C having a variable magnetization direction, and a tunnel barrier layer 270B interposed therebetween. The pinned layer 270A and the free layer 270C may be formed of a single layer or a multiple layer including a ferromagnetic material, for example, an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, Co—Fe—B allow, etc. Positions of the pinned layer 270A and the free layer 270C may be reversed with each other. The tunnel barrier layer 270B may change the magnetization direction of the free layer 270C by the tunneling of electrons during a write operation for storing data. The tunnel barrier layer 270B may be formed of a single layer or a multiple layer including an oxide such as MgO, CaO, SrO, TiO, VO, NbO, etc. When the magnetization directions of the free layer 270C and the pinned layer 270A are parallel to each other, the variable resistance element 270 may exhibit a low resistant state, and, when the magnetization directions of the free layer 270C and the pinned layer 270A are anti-parallel to each other, the variable resistance element 270 may exhibit a high resistant state. Therefore, different data may be stored depending on differences between the resistant states.

However, other limitations may be possible. Instead of the variable resistance element 270, various memory elements storing data, for example, a capacitor may be coupled to one end of the transistor.

A second interlayer dielectric layer ILD2 may be formed over the first interlayer dielectric layer ILD1 and the variable resistance element 270. In the second interlayer dielectric layer ILD2, the first upper contact 280 coupled to the top end of the variable resistance element 270 and the second upper contact 285 coupled to the second lower contact 265 may be formed.

Over the second interlayer dielectric layer ILD2, the bit line 290 extending in the second direction to be coupled to the first upper contacts 280 arranged in the second direction and the source line 295 extending in the second direction to be coupled to the second upper contacts 285 arrange in the second direction may be formed.

The aforementioned semiconductor memory may be fabricated using the transistor having an improved characteristic. Therefore, an operating characteristic of the semiconductor memory may be improved.

The above and other memory circuits or semiconductor devices based on the disclosed technology can be used in a range of devices or systems. FIGS. 4-8 provide some examples of devices or systems that can implement the memory circuits disclosed herein.

Figure 4:
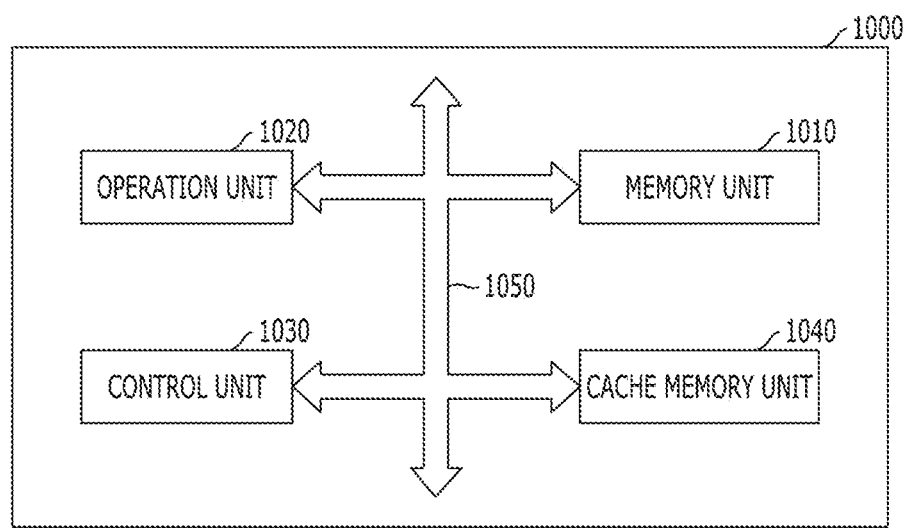
FIG. 4 is an example of configuration diagram of a microprocessor implementing memory circuitry based on the disclosed technology.

FIG. 4 is an example of configuration diagram of a microprocessor implementing memory circuitry based on the disclosed technology.

Referring to FIG. 4, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

At least one of the memory unit 1010, the operation unit 1020 and the control unit 1030 may include one or more of the above-described semiconductor devices in accordance with the implementations. For example, at least one of the memory unit 1010, the operation unit 1020 and the control unit 1030 may include a transistor comprising a semiconductor substrate including an active region defined by an isolation layer; a gate electrode crossing the active region; and a landing plug contact formed over the active region at both sides of the gate electrode, and wherein a top surface of the active region at both sides of the gate electrode has a shape that a center relatively far from the gate electrode is higher than an edge relatively near to the gate electrode. Through this, operating characteristics of at least one of the memory unit 1010, the operation unit 1020 and the control unit 1030 may be improved. As a consequence, operating characteristics of the microprocessor 1000 may be improved.

Figure 5:
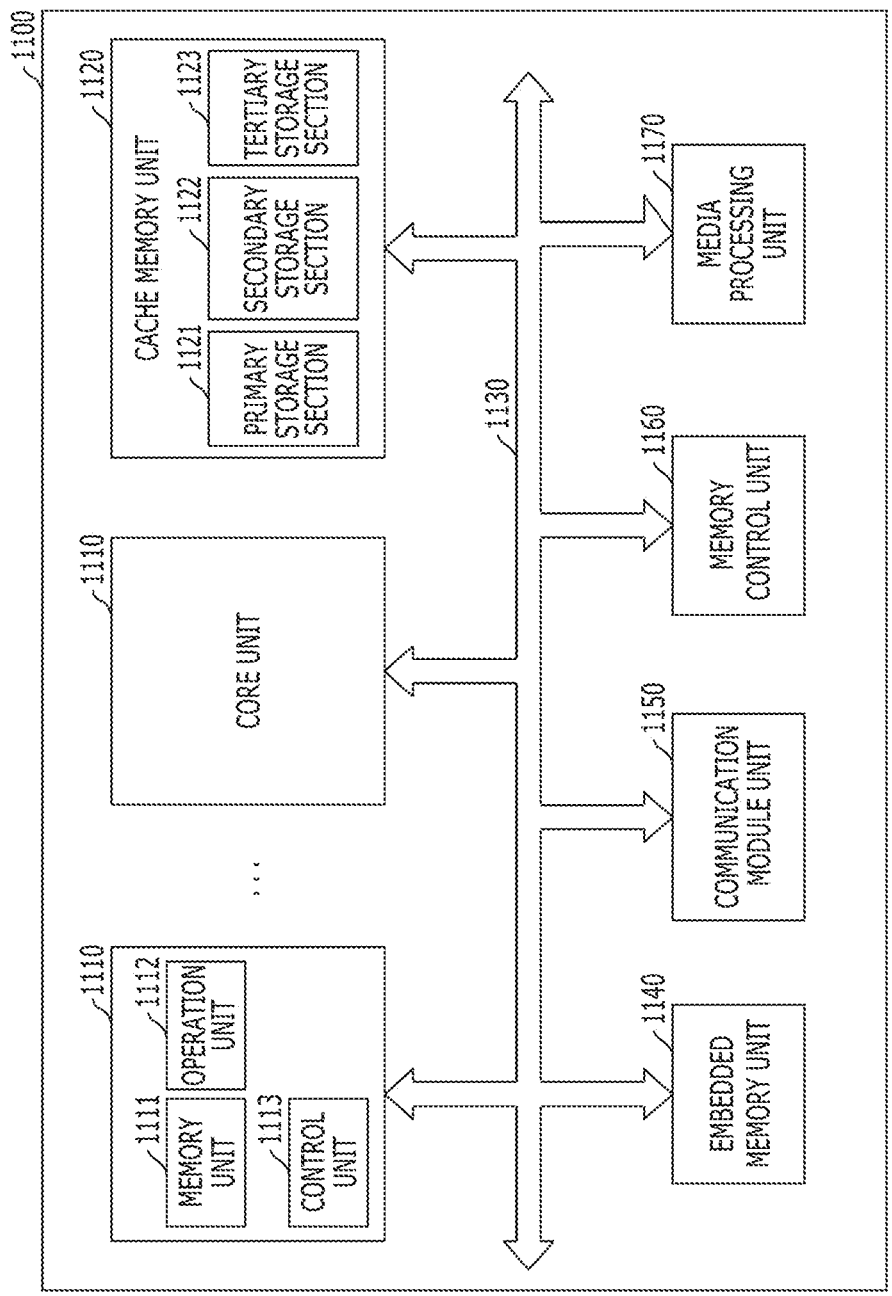
FIG. 5 is an example of configuration diagram of a processor implementing memory circuitry based on the disclosed technology.

FIG. 5 is an example of configuration diagram of a processor implementing memory circuitry based on the disclosed technology.

Referring to FIG. 5, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest.

Although it was shown in FIG. 5 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MIVIC), an embedded MIVIC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

At least one of the cache memory unit 1120, the core unit 1110 and the bus interface 1130 may include one or more of the above-described semiconductor devices in accordance with the implementations. For example, at least one of the cache memory unit 1120, the core unit 1110 and the bus interface 1130 may include a transistor comprising a semiconductor substrate including an active region defined by an isolation layer; a gate electrode crossing the active region; and a landing plug contact formed over the active region at both sides of the gate electrode, and wherein a top surface of the active region at both sides of the gate electrode has a shape that a center relatively far from the gate electrode is higher than an edge relatively near to the gate electrode. Through this, operating characteristics of at least one of the cache memory unit 1120, the core unit 1110 and the bus interface 1130 may be improved. As a consequence, operating characteristics of the processor 1100 may be improved.

Figure 6:
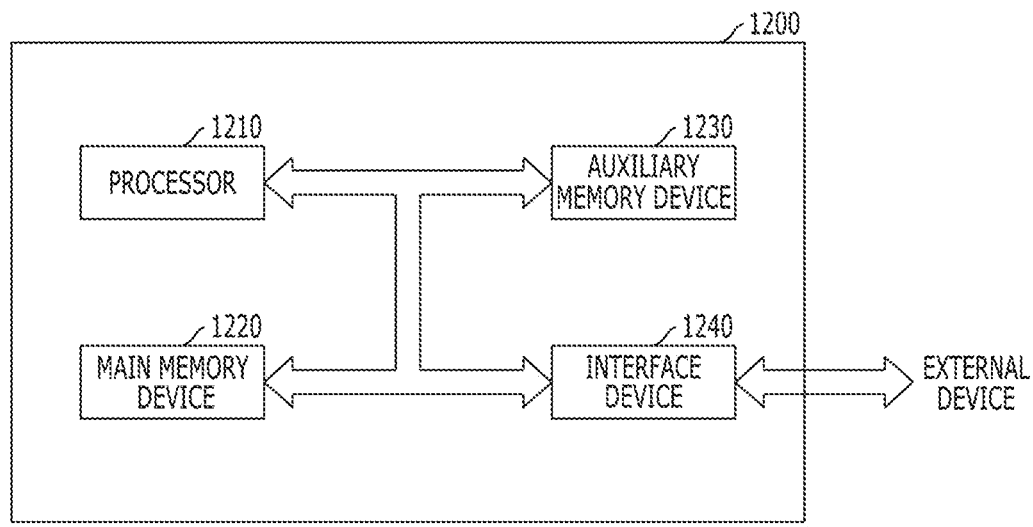
FIG. 6 is an example of configuration diagram of a system implementing memory circuitry based on the disclosed technology.

FIG. 6 is an example of configuration diagram of a system implementing memory circuitry based on the disclosed technology.

Referring to FIG. 6, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

At least one of the processor 1210, the main memory device 1220, the auxiliary memory device 1230 and the interface device 1240 may include a transistor comprising a semiconductor substrate including an active region defined by an isolation layer; a gate electrode crossing the active region; and a landing plug contact formed over the active region at both sides of the gate electrode, and wherein a top surface of the active region at both sides of the gate electrode has a shape that a center relatively far from the gate electrode is higher than an edge relatively near to the gate electrode. Through this, operating characteristics of at least one of the processor 1210, the main memory device 1220, the auxiliary memory device 1230 and the interface device 1240 may be improved. As a consequence, operating characteristics of the system 1200 may be improved.

Figure 7:
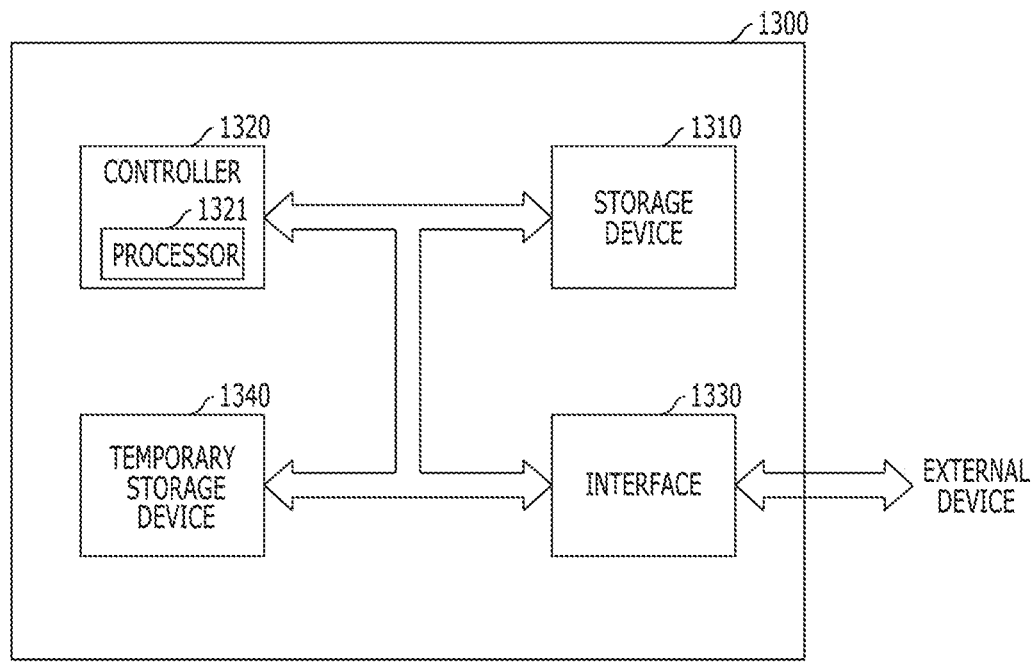
FIG. 7 is an example of configuration diagram of a data storage system implementing memory circuitry based on the disclosed technology.

FIG. 7 is an example of configuration diagram of a data storage system implementing memory circuitry based on the disclosed technology.

Referring to FIG. 7, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system.

At least one of the storage device 1310, the controller 1320, the interface 1330 and the temporary storage device 1340 may include one or more of the above-described semiconductor devices in accordance with the implementations. For example, at least one of the storage device 1310, the controller 1320, the interface 1330 and the temporary storage device 1340 may include a transistor comprising a semiconductor substrate including an active region defined by an isolation layer; a gate electrode crossing the active region; and a landing plug contact formed over the active region at both sides of the gate electrode, and wherein a top surface of the active region at both sides of the gate electrode has a shape that a center relatively far from the gate electrode is higher than an edge relatively near to the gate electrode. Through this, operating characteristics of at least one of the storage device 1310, the controller 1320, the interface 1330 and the temporary storage device 1340 may be improved. As a consequence, operating characteristics of the data storage system 1300 may be improved.

Figure 8:
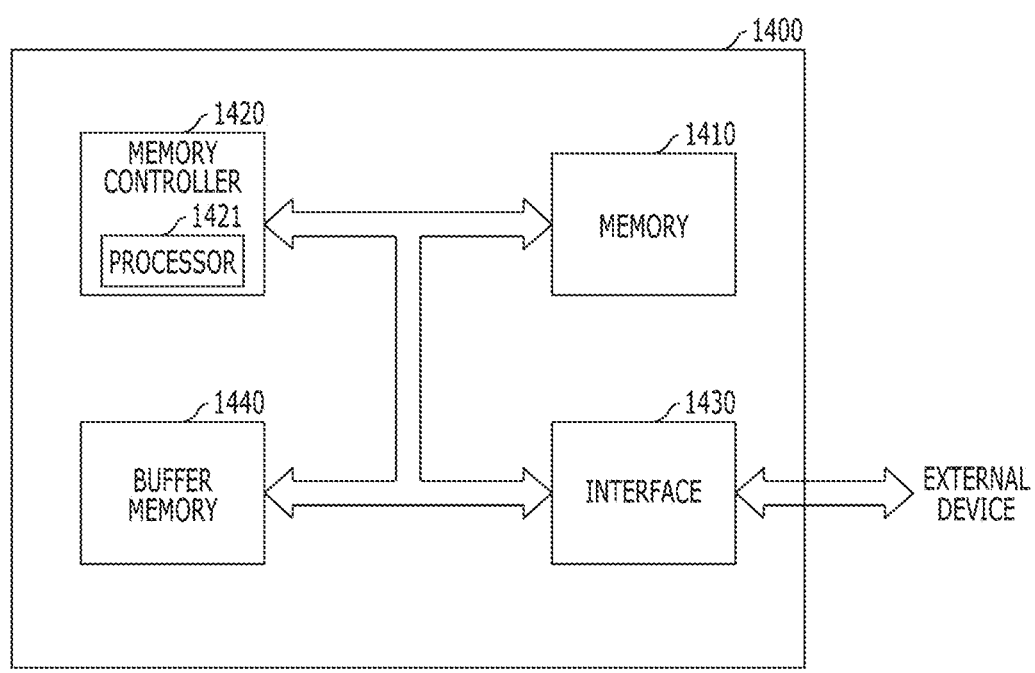
FIG. 8 is an example of configuration diagram of a memory system implementing memory circuitry based on the disclosed technology.

FIG. 8 is an example of configuration diagram of a memory system implementing memory circuitry based on the disclosed technology.

Referring to FIG. 8, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

At least one of the memory 1410, the memory controller 1420, the interface 1430 and the buffer memory 1440 may include one or more of the above-described semiconductor devices in accordance with the implementations. For example, at least one of the memory 1410, the memory controller 1420, the interface 1430 and the buffer memory 1440 may include a transistor comprising a semiconductor substrate including an active region defined by an isolation layer; a gate electrode crossing the active region; and a landing plug contact formed over the active region at both sides of the gate electrode, and wherein a top surface of the active region at both sides of the gate electrode has a shape that a center relatively far from the gate electrode is higher than an edge relatively near to the gate electrode. Through this, operating characteristics of at least one of the memory 1410, the memory controller 1420, the interface 1430 and the buffer memory 1440 may be improved. As a consequence, operating characteristics of the memory system 1400 may be improved.

Features in the above examples of electronic devices or systems in FIGS. 4-8 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. A method for fabricating an electronic device comprising a transistor, comprising:
forming a hard mask pattern over a semiconductor substrate to expose a gate formation region;
forming a gate trench by etching the semiconductor substrate using the hard mask pattern as an etching barrier;
forming a gate insulating layer over an inner wall of the gate trench;
forming a gate electrode in a lower portion of the gate trench in which the gate insulating layer is formed to be in contact with the gate electrode;
forming an insulating material covering a resultant structure in which the gate electrode is formed;

forming a gate protective layer having a top surface lower than a bottom surface of the hard mask pattern by recessing the insulating material;
removing the hard mask pattern;
recessing the semiconductor substrate so that a top surface of the semiconductor substrate is lower than the top surface of the gate protective layer; and
forming a conductive pattern filling a space formed by the recessing of the semiconductor substrate.

2. The method of claim 1, wherein the forming of the gate protective layer is performed to expose the gate insulating layer, and
the method further comprising:
recessing the exposed gate insulating layer after the forming of the gate protective layer.

3. The method of claim 2, wherein the recessing of the exposed gate insulating layer and the removing of the hard mask pattern are performed at the same time.

4. The method of claim 2, wherein the recessing of the exposed gate insulating layer is performed before or after the removing of the hard mask pattern.

5. The method of claim 2, wherein the recessing of the semiconductor substrate is performed using a top surface of the recessed gate insulating layer as a target.

6. The method of claim 2, wherein the recessing of the semiconductor substrate is performed using an isotropic etching method.

7. The method of claim 6, wherein the semiconductor substrate includes a silicon, and
the recessing of the semiconductor substrate is performed using $NF_3$ gas.

8. The method of claim 1, wherein the semiconductor substrate includes a silicon,
the conductive pattern includes a metal, and
the method further comprising:
forming a metal silicide layer at an interface between the conductive pattern and the semiconductor substrate by performing a heat treatment, after the forming of the conductive pattern.

9. The method of claim 1, further comprising:
forming a memory element coupled to the conductive pattern, after the forming of the conductive pattern.

10. A method for fabricating an electronic device comprising a transistor, comprising:
forming a gate trench by selectively etching a semiconductor substrate;
forming a gate insulating layer over an inner wall of the gate trench;
forming a gate electrode by filling an electrically conductive material into a lower portion of the gate trench in which the gate insulating layer is formed;
forming a gate protective layer located in the gate trench and over the gate electrode;
recessing the gate insulating layer so that a portion of the semiconductor substrate protrudes above the gate insulating layer;
recessing the semiconductor substrate by performing an isotropic etching to the protruding portion of the semiconductor substrate; and
forming a conductive pattern filling a space formed by the recessing of the semiconductor substrate.

11. The method of claim 10, wherein the recessing of the semiconductor substrate is performed using a top surface of the recessed gate insulating layer as a target.

12. The method of claim 10, wherein the semiconductor substrate includes a silicon, and
the recessing of the semiconductor substrate is performed using $NF_3$ gas.

13. The method of claim 10, wherein the semiconductor substrate includes a silicon,
the conductive pattern includes a metal, and
the method further comprising:
forming a metal silicide layer at an interface between the conductive pattern and the semiconductor substrate by performing a heat treatment, after the forming of the conductive pattern.

14. The method of claim 10, further comprising:
forming a memory element coupled to the conductive pattern, after the forming of the conductive pattern.

* * * * *